United States Patent [19]

White

[11] 4,375,652
[45] Mar. 1, 1983

[54] HIGH-SPEED TIME DELAY AND INTEGRATION SOLID STATE SCANNER

[75] Inventor: James M. White, Mint Hill, N.C.

[73] Assignee: International Business Machines Corporation, Armonk, N.Y.

[21] Appl. No.: 313,882

[22] Filed: Oct. 22, 1981

[51] Int. Cl.³ .................... H04N 3/15; H01L 27/14
[52] U.S. Cl. .................................... 358/213; 357/24
[58] Field of Search ............ 357/24 LR, 30; 358/213, 358/212, 109, 293; 307/221 D

[56] References Cited

U.S. PATENT DOCUMENTS 3,502,802  12/1966  Osborn et al. ................. 178/7.1
3,833,762  6/1973  Gudmundsen ................. 178/7.1

Primary Examiner—John C. Martin
Attorney, Agent, or Firm—E. R. Coffman

[57] ABSTRACT

Efficient opaque metal conductors extending across the light receiving surface of a time delay and integration scanning array, are arranged at an angle to the array so as to make their interference with light, projected onto the array, substantially uniform. An anamorphic lens distorts the image projected onto the array to enable more convenient and efficient use of the array surface area.

3 Claims, 4 Drawing Figures

HIGH-SPEED TIME DELAY AND INTEGRATION SOLID STATE SCANNER

BACKGROUND OF THE INVENTION

Solid state linear scanning arrays are known for the electronic capture of image data from documents or other objects. A linear array inherently requires relative movement with respect to the image source to progressively expose line images which together constitute an image area. Solid state linear arrays currently operate by developing, point-by-point in individual cells of the array, electrical charge proportional to the light exposed to corresponding individual sensing devices. The speed at which images can be processed is limited by the inherent light sensitivity of the sensing devices, as well as the strength of the available light source.

One known technique for increasing the sensitivity of such a scanner is known as time delay and integration (TDI) which is described, for example, in U.S. Pat. No. 3,833,762. A TDI array provides a series of linear arrays whose charge developing cells are coupled in the direction of relative movement of the image, such that the same line image progressively is exposed to succeeding ones of the linear arrays. The coupling of the developed arrays enables charge developed by the cells of each array to be transferred to a subsequent cell in the series in a timed relation to the progress of the line image along the series of arrays. This arrangement effectively allows a longer total exposure time of a given line image to sensing devices. In fact, the exposure time can be increased as desired by simply increasing the number of cells in the series to which the line image will be exposed.

To operate such a TDI array, certain control signals must be applied to the cells to cause the development and transfer of electrical charge at proper times. These signals must be applied at a rate that is related to the speed of progress of the line image relative to the scanner array. Normally, the conductors for applying these signals are made part of the solid state device by the use of semi-transparent conductive material such as polysilicon. The transparency of the material is required in order that the control member not interfere with the reception of light by the underlying photosensitive surface. The speed and accuracy with which the control signals can be applied are limited by the relative low-conductivity of the polysilicon, which becomes particularly significant in a TDI array due to the long distances over which the signals must be conducted. The speed of application of the control signals directly limits the permitted speed of the line image relative to the array. The accuracy of the control signal is especially significant in that any error in the transfer of charge causes an accumulated error which can degrade, if not completely destroy, the image being progressively captured.

SUMMARY OF THE INVENTION

This invention employs relatively opaque metal conductors to apply the control signals across the length of a TDI scanning array and orients the conductors angularly across the array to minimize the interference with light and to make such interference as does exist, uniform throughout the array.

To maintain the array physically as small as possible and still be able to reliably make interconnections between the metal control lines and conductive regions of the sensing device, I prefer to elongate the light sensing regions in the direction of the relatively short or integration dimension of the array, thus making the sensing regions not square. Since it is usually desirable to sense square picture elements from the document or other image source, my invention employs an anamorphic lens that distorts square picture elements into an elongated form, similar to the distorted sensing regions, such that the light received by the distorted sensing region actually represents light from a square picture element. The data thus collected will be equivalent to that obtained from square picture element sensing regions imaged through a symmetrical lens.

These and other features, objects and advantages of my invention will appear and be better understood by those skilled in the art, from the following description of an illustrative preferred embodiment wherein reference is made to the accompanying drawing, of which:

Figure 1:
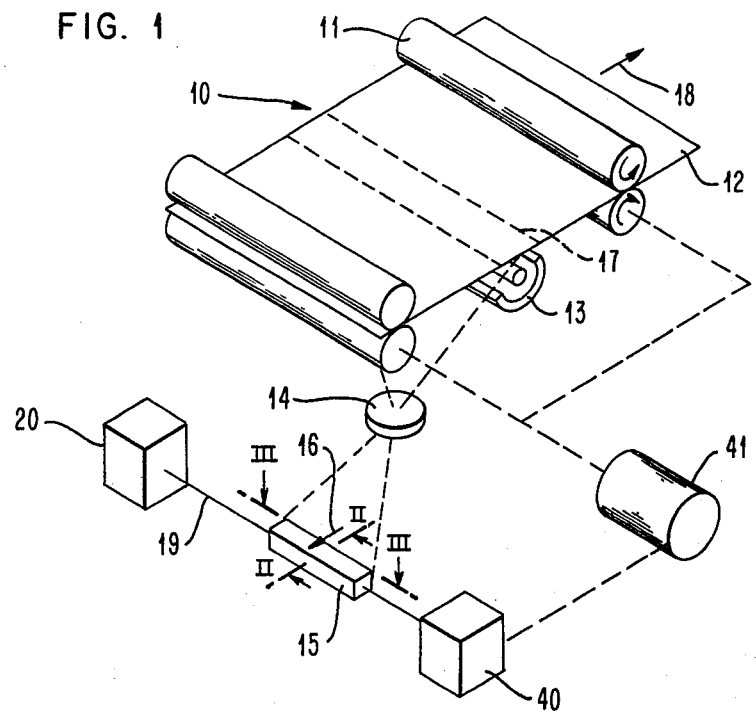
FIG. 1 is a fragmentary perspective view of a document scanner having a TDI image sensing array, constructed in accordance with my invention.
Figure 3:
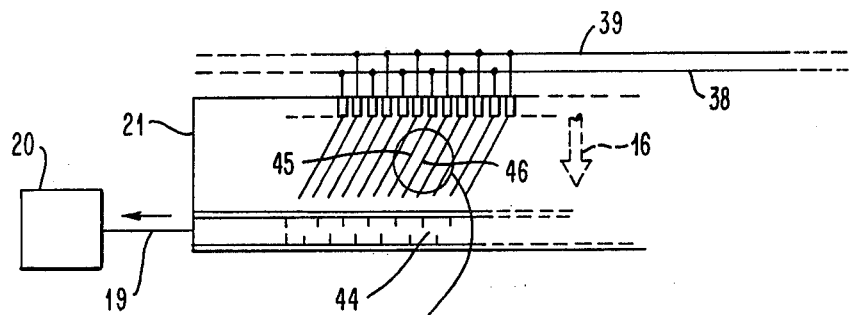
Figure 4:
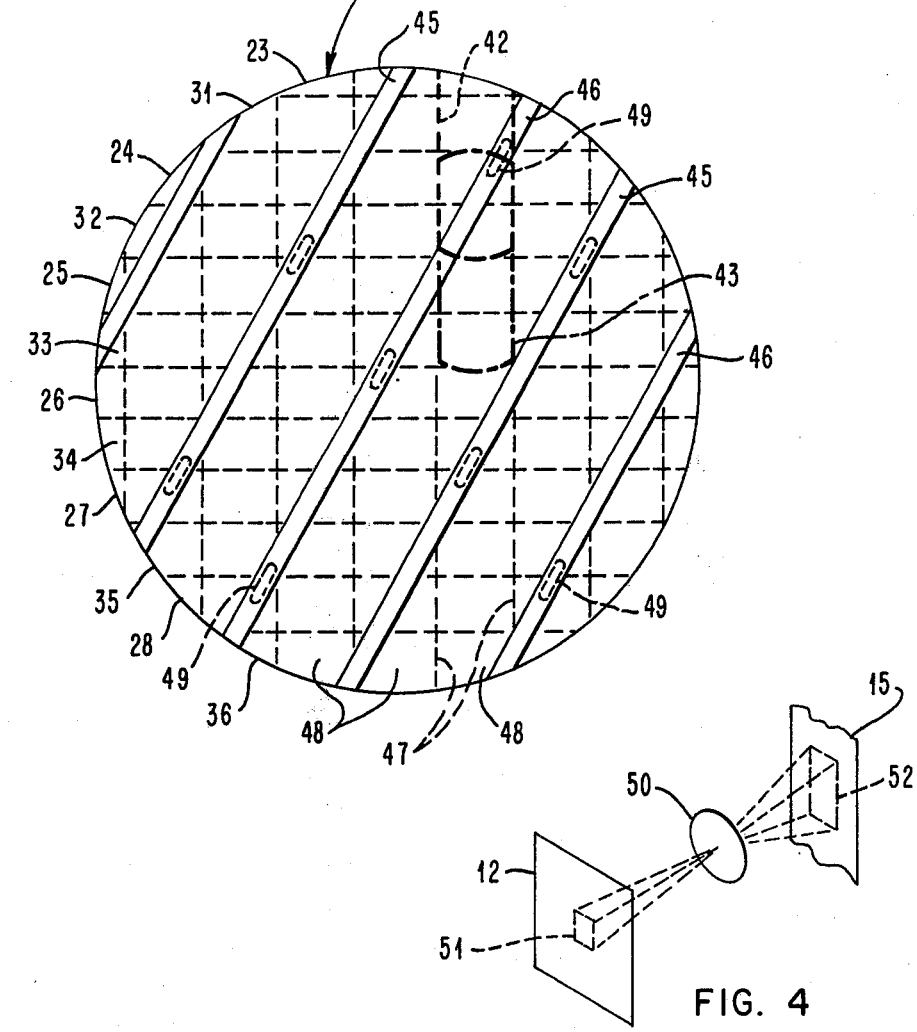

FIG. 3 is a plan view of the TDI array shown in FIG. 1, and taken along lines III—III thereof, and includes a highly magnified detailed portion illustrating the angle-mounted electrical conductors of my invention; and FIG. 4 is a fragmentation perspective explanatory view showing, in simplified form, the operation of an anamorphic lens, as used in the preferred embodiment of my invention, as shown in FIG. 1.

FIG. 1 shows an image scanner 10, including a document-feed transport 11 for moving a document 12 past a light source 13 and lens 14. A time delay and integration (TDI) array 15 receives a projected light or other radiation image represented by arrow 16 from lens 14 of a transverse region 17 extending across the document. As the document 12 moves in the direction of arrow 18, the image of region 17 traverses the surface of TDI array 15 in the direction of arrow 16. As is hereinafter described in detail, TDI array 15 produces, line by line, an electronic analog image replica of the light image of document 12. This electronic image is transmitted by line 19 to processing circuitry 20 for utilization by a variety of known techniques unrelated to the understanding of the present invention. The circuitry 20 can, for example, be used to create a facsimile image for transmission to a remote location, or to supply an image of character shapes or other patterns for recognition.

Although scanner 10 shows document 12 being moved by a transport, it will be recognized that my invention is equally applicable to a system wherein the moving image 16 is produced through motion of a lens or other optical device. In addition, the array 15 could, itself, move with respect to a stationary scene as, for example, in a security surveillance camera that rotates through a viewing arc.

Figure 2:
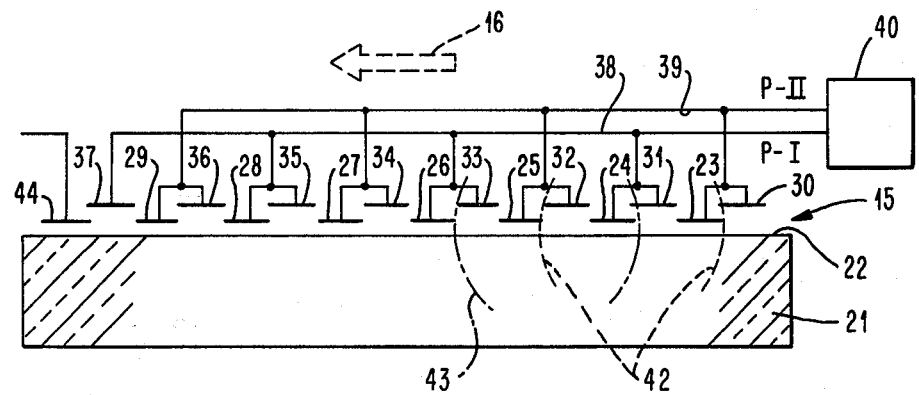
FIG. 2 is an enlarged pseudo cross-sectional elevational view of the TDI sensing array shown in FIG. 1 and taken along lines II—II thereof.

FIG. 2 shows a greatly enlarged cross-sectional elevational view of the TDI array shown in FIG. 1, wherein the elements have been illustrated schematically for ease of understanding. This view illustrates the region of array 15 that progressively collects charge in response to a single picture element of a line of region 17 that is transverse to the transport direction 18, (FIG. 1). The TDI array 15 consists of a silicon body member or wafer 21 that is capable of freeing electrons in response to light. Adjacent to and insulated from the light receptive upper surface 22 of wafer 21, is a series of charge collection electrodes 23, 24, 25, 26, 27, 28 and 29. A positive voltage applied to one of these electrodes will cause the accumulation of electrons freed in the silicon 21 by the incidence of light in the region of the electrode to be collected adjacent the electrode to a degree proportional to the incidence of light in that region. Charge transfer electrodes 30, 31, 32, 33, 34, 35, and 36 are positioned between the charge collection electrodes and are spaced somewhat further from wafer 21 than are the charge collection electrodes. A positive voltage applied to a charge transfer electrode, such as 31, at a time when voltage is removed from an adjacent charge collection electrode, for example 23, will cause the charge accumulated under the charge collection electrode 23 to shift laterally through wafer 21 to a position under the transfer electrode 31. As shown in FIG. 2, transfer electrode 31 is electrically connected to the more closely spaced charge collection electrode 24 which extends a stronger potential into the surface of the wafer 21 than does electrode 31. Thus, the charge moved from collection electrode 23 by transfer electrode 31 continues to move to a position under charge collection electrode 24.

The TDI array shown in FIG. 2 operates on two phases or alternate operating states (P-I and P-II). Adjacent pairs of transfer and charge collection electrodes are connected for simultaneous positive voltage reception through lines connected to control lines 38 and 39. Control circuit 40 operates in synchronism with the drive motor 41 for transport 11 to apply positive voltage alternately to lines 38 and 39. This action causes charge accumulations to step leftwardly along the surface of silicon wafer 21, in synchronism with the leftward motion of the image 16. Thus, a line image portion from region 17 in FIG. 1, which exposes a charge accumulation site 42 of the wafer 21 centered under electrodes 24 and 31, will cause an accumulation of charge at P-I time when line 38 is positive. As image 16 moves leftwardly, voltage is removed from P-I and applied to P-II, thus making charge transfer electrode 32 effective to laterally attract the charge accumulated by electrode 23 into the influence of charge collection electrode 25 at charge accumulation site 43. During the time P-II is operative, collection electrode 25 also is collecting additional charge in proportion to the same line image which now has moved leftwardly to be centered on electrode 25. Subsequently, at P-I positive voltage from line 39 is removed and restored to line 38 so that charge transfer electrode 33 attracts the total charge accumulated at electrode 25 leftwardly, and brings it to charge collection electrode 26 in synchronism with the further leftward progress of image 16. This process continues until the charge that has accumulated through these progressive steps is deposited under an output electrode which, in a known manner, can be one stage of a high-speed shift register 44 that puts an entire line of image data onto line 19 to be supplied to the processing circuitry 20.

From the foregoing explanation, it can be seen how the capability of voltage to be rapidly applied to and removed from the various electrodes through the P-I AND P-II lines 38 and 39 will determine the maximum relative speed of image 16 that can be successfully tracked. The electrodes, e.g., 23, 31, etc., are made from polysilicon and thus are both conductive and semi-transparent. These electrodes extend the length of the scanner array transverse to the cross-sectional view of FIG. 2. Connections to these electrodes can conventionally be made at either or both ends, which requires that the voltage be conducted through relatively poor conductors for at least half a length of the array 15. Increasing the conductivity of the polysilicon electrodes, by either thickening or broadening, is counterproductive beyond a point. Thickening reduces the transparency, thereby making the device less sensitive. Broadening the surface area increases the line capacitance which reduces the permissible accurate cycling rate. These obstacles to increased speed of operation and sensitivity are overcome, as shown in FIG. 3, by the provision of angled metal conductors, such as 45 and 46 shown in FIG. 3.

FIG. 3 shows the entire top surface of the TDI array 15, across which the image 16 moves as shown by the arrow. The details of the surface are best seen in the greatly magnified portion of FIG. 3. In accordance with known technology, the wafer 21 is divided by oxide barrier regions 47 into a plurality of channels 48. Barriers 47 limit the sidewise migration of charge and thus define one dimension of a picture element or charge accumulation site 42 from which light-released electrons are collected. The channels are traversed by the electrodes 23, 31, 24, 32, etc., as described in connection with FIG. 2. Diagonally crossing the electrodes and channels, are the highly conductive, relatively opaque conductors 45, 46. These conductors are connected at regions 49 to adjacent pairs of control electrodes such as the charge transfer electrodes 21 and charge collection electrode 34. All of the conductors 45 are connected to P-I control line 38, and all of the conductors 46 are connected to the P-II control lines 39. From FIG. 3, it can be seen that the distance required for electrical conduction along the length of the polysilicon electrode is reduced to essentially half the distance between the like phase conductors 45. Furthermore, although the conductors 45 and 46 obstruct the free access of the upper surface 22 of silicon 21 to light, this obstruction is distributed uniformly across channels 48 so as not to cause local degradation or localized loss of the image along the length of the device.

It is necessary to have some minimum contact area available between a metal conductor such as 46 and the pair of polysilicon electrodes such as 31 and 24 to be able to reliably make the required electrical connection. It is desirable to keep the silicon wafer 21 as small as possible in its longest dimension to simplify manufacturing processes. To obtain additional surface area for the purpose of making connections without increasing the length of the scanner array, I prefer to expand the size of the wafer 21 in the integration direction, that is, vertically in FIG. 3. This is accomplished by selecting control electrodes 31, 24, 32, 25, etc., which are large in the vertical direction of FIG. 3 to cause the vertical dimension of charge collection site 42 to be elongated with respect to the width of channels 48. Typical charge collecting sites such as 42 and 43 are shown bordered by heavy broken and chain lines, respectively, in FIG. 3. Thus, charge-collecting site 42 is represented by the broken line outline in FIG. 3, as that region within a channel 48 that is centered around electrodes 24 and 31 when they are effective during P-I time when positive voltage is applied to the conductor 46. Similar sites are simultaneously created in each of the channels 48, centered around the electrodes 24 and 31 as well as the other P-I control electrodes 26, 28, etc. Similarly, during the P-II time, the charge collecting site 43 moves downwardly in FIG. 3 by approximately half its length, to become 43 centered around electrodes 25 and 33, as shown by the chain line outline.

From this description, it can be seen that the light-sensitive areas are significantly elongated in the integration direction, whereas, as mentioned above, it is desirable for most electronic image processing systems to collect images of a symmetrical or square-like character. This result is accomplished with my invention through the use of an anamorphic lens 50, as shown in FIG. 4. The anamorphic lens is designed according to known optical techniques used, for example, in the field of cinematography to provide a greater degree of optical reduction along one axis than the other, such that for purposes of my invention, an essentially square region 51 from document 12 is projected as an elongated region 52 onto the surface of TDI device 15. The charge accumulated by an elongated site such as 43 will be thus essentially proportional to the light reflected from a square region 51 of the original document.

I claim:

1. An image scanner for converting a radiation image pattern into an electronic image, including a time delay and integration array and means for moving the radiation image pattern relative to the array along a first direction, the array including a semiconductor member having a plurality of contiguous photosensitive electrical charge holding regions, each of said regions extending along said first direction and having a radiation receptive surface, and a plurality of control electrodes, each extending substantially at right angles to said first direction and overlying adjacent portions of the radiation receptive surface of said regions, said control electrodes being capable of conducting both said radiation pattern and electrical current, control means for applying control voltages to selected ones of said control electrodes in synchronism with said relative movement, and a plurality of relatively opaque electrical conductors extending angularly across said regions and said control electrodes and interconnecting said control means with said control electrodes.

2. An image scanner, as defined in claim 1, wherein said conductors are evenly spaced across the surface of said semiconductor member.

3. An image scanner, as defined in claim 1, wherein said control electrodes and said semiconductor regions define picture elements charge accumulation sites of elongated shape, having the dimension aligned with said first direction larger than the dimension transverse thereto, and anamorphic lens means for projecting said radiation image onto said sites with a proportionally lesser optical reduction in the longer dimension of said site than in the transverse dimension thereof.

* * * * *